United States Patent [19]
Gregory et al.

[11] Patent Number: 4,945,065
[45] Date of Patent: Jul. 31, 1990

[54] METHOD OF PASSIVATING CRYSTALLINE SUBSTRATES

[75] Inventors: James A. Gregory, Sudbury; Jack I. Hanoka; Zinovy Y. Vayman, both of Brookline, all of Mass.

[73] Assignee: Mobil Solar Energy Corporation, Billerica, Mass.

[21] Appl. No.: 201,559

[22] Filed: Jun. 2, 1988

[51] Int. Cl.$^5$ .................. H01L 21/223; H01L 21/322; H01L 31/18
[52] U.S. Cl. ............................ 437/4; 437/24; 437/980; 136/258
[58] Field of Search .................... 437/3, 4, 5, 980, 24; 136/258

[56] References Cited
U.S. PATENT DOCUMENTS

| | | | |
|---|---|---|---|
| 4,522,663 | 6/1985 | Ovshinsky et al. | 136/258 |
| 4,569,697 | 2/1986 | Tsu et al. | 437/2 |
| 4,613,382 | 9/1986 | Katayama et al. | 437/18 |
| 4,637,869 | 1/1987 | Glocker et al. | 204/192.11 |
| 4,751,191 | 6/1988 | Gonsiorawski et al. | 437/2 |

FOREIGN PATENT DOCUMENTS 59-107576  6/1984  Japan .................. 136/258

OTHER PUBLICATIONS

Seager et al., J. Vac. Sci. Technol., 20 (3) (Mar. 1982), pp. 430–435.

*Primary Examiner*—Olik Chaudhuri
*Attorney, Agent, or Firm*—Schiller, Pandiscio & Kusmer

[57] ABSTRACT

A method of bulk passivating a crystalline or polycrystalline substrate made from silicon, germanium, gallium arsenide or other III-V compounds, and II-VI compounds by exposing the substrate to a fluorine ion beam created by a Kaufman ion source. The Kaufman ion source is controlled so that the intensity of and duration of exposure to the fluorine ion beam is sufficient to bulk passivate the substrate. Preferably, the substrate is preheated to a selected temperature prior to the ion beam exposure.

6 Claims, 1 Drawing Sheet

METHOD OF PASSIVATING CRYSTALLINE SUBSTRATES

BACKGROUND OF THE INVENTION

1. Field of the Invention

This invention pertains to the passivation of crystalline substrates used in the fabrication of semiconductor devices, and more particularly to the fluorine passivation of polycrystalline silicon, germanium, gallium arsenide or other III-V compound substrates, and II-VI compound substrates (e.g., cadmium telluride, zinc sulfide, and zinc selenide) used in the fabrication of semiconductor devices.

2. Prior Art

It is well known that dislocations, grain boundaries and the like present in crystalline silicon, germanium, gallium arsenide and other III-V compound and II-VI compound semiconductor materials give rise to minority carrier recombination. It is thought that the so-called bent, dangling, or stretched bonds believed to exist at these crystalline defects give rise to energy levels where minority carriers recombine so as to render the minority carriers electrically inactive. Since the efficiency of a semiconductor device depends, in part, on the number of available charge carriers, it is desirable to reduce the incidence of such recombination.

Bulk hydrogen passivation has been widely employed in the fabrication of semiconductor devices, especially solar cells, made from p-type polycrystalline silicon substrates, as a method of reducing minority carrier recombination losses. For instance, in U.S. Pat. No. 4,557,037, hydrogen passivation is employed in the fabrication of solar cells as a method of improving cell efficiency by reducing recombination. J. I. Hanoka in the article "Hydrogen Passivation of Polycrystalline Silicon", published in *NATO ASI Series B: Physics*, vol. 136, 1986, pp. 81-90, Plenum Press, New York, describes the effects of hydrogen passivation of a polycrystalline substrate.

Bulk hydrogen passivation has a significant disadvantage when performed in conjunction with a semiconductor fabrication process involving relatively high temperature, i.e. above 325° C., process steps. In large part because the silicon-hydrogen bond is relatively weak, hydrogen tends to migrate out of the silicon substrate at temperatures above about 325° C. This break up of the silicon-hydrogen bond, which reduces the benefits of passivation, is especially problematic when the substrate is exposed to subsequent higher temperature processing steps.

In part as an attempt to overcome these drawbacks of known hydrogen passivation processes, fluorine has been used as a passivant in amorphous silicon. Fluorine was chosen as a passivant since the bonding energy of the silicon-fluorine bond is up to 60% greater than that of the silicon-hydrogen bond. H. Matsumura, Y. Nakagome and S. Furukawa in the article "A Heat-Resisting New Amorphous Silicon", published in *Applied Physics Letters*, vol. 36(6), Mar. 15, 1980, pp. 439-440, disclose a method of bulk passivating an amorphous silicon substrate using $SiF_4$ gas. Fluorine passivation of amorphous silicon substrates is also disclosed in U.S. Pat. Nos. 4,605,941, 4,522,663 and 4,520,380 to Ovshinsky et al, and U.S. Pat. No. 4,569,697 to Tsu et al. C. J. Fang, L. Ley, H. R. Shanks, K. J. Gsuntz, and M. Cardona in the article "Bonding Of Fluorine In Amorphous Hydrogenated Silicon", published in *Physical Review B*, vol. 22(12), Dec. 15, 1980, pp. 6140-6148, disclose the results of infrared spectra measurement experiments of fluorinated amorphous silicon. The silicon samples were passivated by Fang et al in a conventional rf sputtering system. T. Shimada, Y. Katayama, and S. Horigome in the article "Infrared Spectra Of Amorphous Silicon-Fluorine Alloys Prepared By Sputtering In Fluorosilane-Argon Gas Mixture", published in *Japanese Journal of Applied Physics*, vol. 19(5), May, 1980, pp. L265-L268, discuss the infrared spectra of fluorine passivated amorphous silicon. The silicon samples were passivated by Shinada et al in the diode-type rf reactive sputtering system. No bulk fluorine passivation of polycrystalline silicon was effected by the methods of the foregoing articles. Nor were Kaufman ion sources used to create the fluorine ion beam.

Surface passivation of p-type crystalline silicon using fluorine as the passivant has also been attempted. B. R. Weinberger, H. W. Deckman, E. Yablonovitch, F. Gmitter, W. Kobasy, and S. Garoff in the article "The Passivation Of Electrically Active Sites On The Surface Of Crystalline Silicon By Fluorination", published in the *Journal of Vacuum Science Technology A*, vol. 3(3), May/June, 1985, pp. 887-891, disclose a method which allegedly provides surface passivating p- and n-type crystalline silicon substrates by fluorination. This method involves immersing the silicon sample in an aqueous HF solution. In a subsequent article, it was determined that hydrogen surface passivation and not fluorine surface passivation is achieved by the process described in the Weinberger et al article. See, E. Yablonovitch, D. L. Allara, C. C. Change, T. Gmitter, and T. B. Bright, "Unusually Low Surface-Recombination Velocity on Silicon and Germanium Surfaces", *Physical Review Letters*, vol. 57, no. 2, July 14, 1986, pp. 249-252.

B. R. Weinberger, G. G. Peterson, T. C. Eschrich, and H. A. Kransinski in the article "Surface Chemistry of HF Passivated Silicon: X-ray Photoelectron and Ion Scattering Spectroscopy Results", *Journal of Applied Physics*, vol. 60 (9), Nov. 1, 1986, pp. 3232-3234, disclose a process for fluorine surface passivating a silicon surface.

Bulk fluorine passivation of crystalline substrates has been attempted using plasmas. D. S. Ginley in the article "Modification Of Grain Boundaries In Polycrystalline Silicon With Fluorine And Oxygen", published in *Applied Physics Letter*, vol. 39(8), 15 October 1981, pp. 624-626, discloses a method used in an attempt to bulk fluorine passivate a p-type silicon substrate using a dc plasma device. Bulk passivation of the p-type crystalline substrate was not achieved. K. S. Jones and S. J. Pearton in the article "Grain Boundaries In Germanium: Effects Of Exposure To Plasmas", published in *Conference Proceedings*, from the 13th International Conference of Defects in Semiconductors, pp. K101-K103, describe an unsuccessful attempt to fluorine passivate a germanium substrate.

As the foregoing references indicate, fluorine passivation of amorphous silicon substrates is well known. On the other hand, bulk fluorine passivation of p-type crystalline, especially polycrystalline, silicon and germanium substrates has not been achieved to date.

OBJECTS OF THE INVENTION

A primary object of the present invention is to provide a method of bulk passivating a crystalline or polycrystalline silicon, germanium, gallium arsenide or other III-V compound or II-VI compound substrate so that the resultant silicon-passivant bonds are stronger than the silicon-hydrogen bonds formed by conventional hydrogen passivation of the substrate.

Another object of the present invention is to bulk passivate a crystalline or polycrystalline silicon, germanium, gallium arsenide or other III-V compound or II-VI compound substrate by exposing the substrate to a fluorine ion beam created by a Kaufman ion source.

SUMMARY OF THE INVENTION

These and other objects are achieved by a method of bulk fluorine passivating a crystalline or polycrystalline silicon, germanium, gallium arsenide or other III-V compound substrate that includes, inter alia, the steps of:

(a) supporting the substrate so as to be exposed to a Kaufman ion source;

(b) exposing one surface of the substrate to a fluorine ion beam of an intensity and for a duration sufficient to bulk passivate the substrate, the one surface not being covered with a dielectric layer.

As used herein, bulk passivation refers to the introduction of ions into the semiconductor substrate. These ions interact with atoms present in the substrate in a manner significantly reducing intragranular and granular recombination. It is believed the injected ions interact with the bent, dangling, or stretched bonds of the material in a manner substantially reducing the ability of the latter to recombine with the minority carriers.

DETAILED DESCRIPTION OF THE INVENTION

Figure 1:
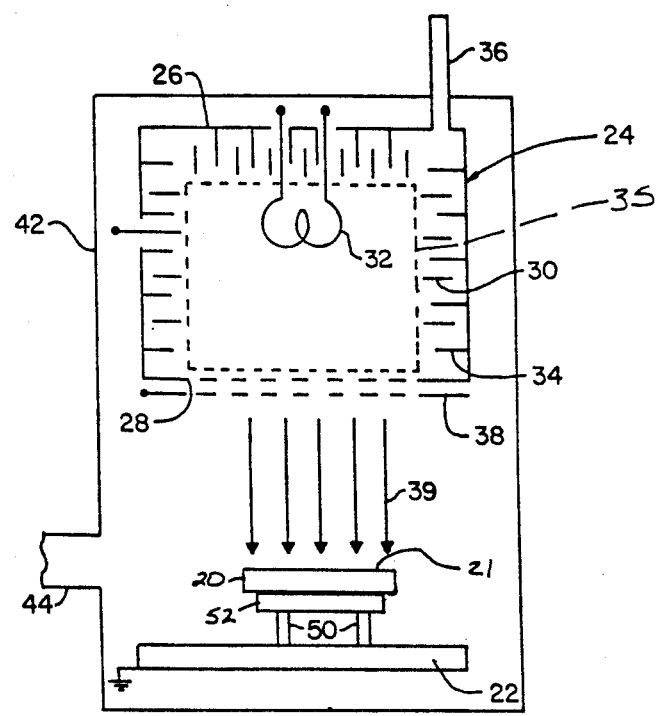
FIG. 1 is a schematic diagram showing the relationships between the silicon substrate and a Kaufman ion source used in performing the present method.
Figure 2:
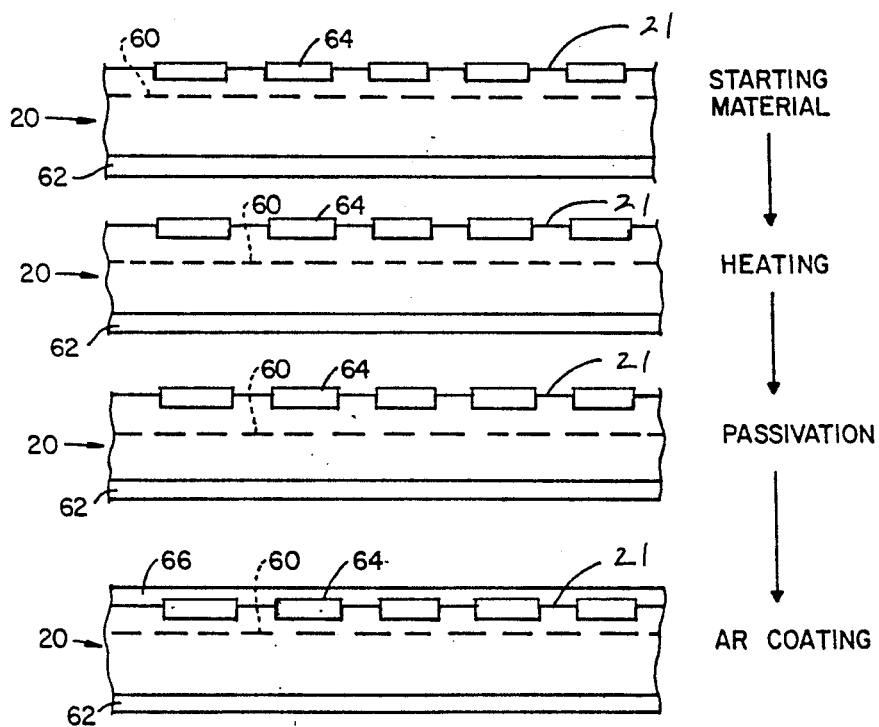
FIG. 2 illustrates the several steps involved in bulk passivating a silicon substrate according to the present method. For convenience of illustration, the thicknesses and depths of the several coatings and regions are not drawn to scale.

Referring to FIGS. 1 and 2, the present invention relates to the bulk passivation of crystalline or polycrystalline substrates made from various suitable materials including silicon, germanium, gallium arsenide or other III-V compounds (i.e. compounds made from elements in columns III and V of the periodic table), and II-VI compounds (i.e. compounds made from elements in colums II and VI of the periodic table). A substrate 20 made from one of these various materials is provided as the starting material. At least one surface (hereinafter the "front surface") 21 is not coated with any dielectric material which would limit the effectiveness of the ion-beam exposure step discussed below. Such dielectric materials include, for instance, silicon nitride or a phosphorosilicate glass.

As the first step in the present method, substrate 20 is secured to target 22 (FIG. 1) positioned beneath a Kaufman ion source 24, the latter being of the type disclosed in U.S. Pat. Nos. 3,913,320, 4,419,203, 4,446,403 and 4,541,890. Briefly, Kaufman ion source 24 comprises a hollow housing 26 having an open end 28. Anode 30, cathode 32 and magnets 34 are arranged inside of housing 26 so as to ionize a gas admitted into the housing through port 36. In the present invention, port 36 is coupled to a source (not shown) of silicon tetrafluoride ("SiF$_4$") gas. An accelerator grid 38 is attached to housing 26 so as to block open end 28. Grid 38 preferably comprises a pair of parallel, spaced-apart plates having a plurality of apertures formed therein. Grid 38, anode 30 and cathode 32 are coupled to suitable electrical potential sources (not shown). SiF$_4$ gas introduced into housing 26 is ionized by the potential applied between anode 30 and cathode 32. Magnetic field 35 formed by magnets 34 distributes the SiF$_4$ plasma throughout the interior of housing 26. The potential applied to accelerator grid 38 accelerates the SiF$_4$ ion plasma out of housing 26 through the apertures in the grid 38 in the form of an SiF$_4$ ion beam 38. The entire Kaufman ion source 24 as well as target 22, the latter being at ground potential, are disposed within a vacuum chamber 42. The latter is pneumatically coupled, via vacuum port 44 formed in housing 42, to a vacuum source (not shown) which is adapted to evacuate the interior of chamber 42. Such evacuation is effected prior to operation of the ion source 24.

Preferably, substrate 20 is substantially thermally isolated from target 22 by supporting the substrate on support members 50, the latter being made from a material that is a relatively poor conductor of heat energy, e.g. fused quartz. A heating device 52, such as a conventional resistive heater, is positioned on target 22 adjacent support members 50 for heating the substrate 20 during the passivation process. Support members 50 are provided so that the heat supplied by heating device 52 is not conducted away from substrate 20 via target 22.

In the following step, heating device 52 is operated so as to raise the temperature of substrate 20 to a selected level. As discussed below, substrate 20 is heated to encourage the diffusion of fluorine into the bulk of the substrate.

Next, Kaufman ion source 24 is actuated so as to subject substrate 20 to SiF$_4$ ion beam 39. Kaufman ion source 24 is controlled so that the intensity of and duration of exposure to the SiF$_4$ ion beam 39 are such that substrate 20 is bulk passivated.

Thereafter, substrate 20 is allowed to cool and then is removed from support member 50.

While SiF$_4$ is the preferred passivant source gas, other gaseous fluorine compounds may also be satisfactorily employed. For instance, nitrogen trifluoride (NF$_3$) may be used as the source gas.

Preferred Embodiment

Referring to FIGS. 1 and 2, in the preferred embodiment of the present invention, substrate 20 comprises a conventional EFG (edge-defined film-fed growth) silicon solar cell substrate having a p/n junction 60, an aluminum backing layer 62 and metallic conductors 64. The p/n junction 60 was formed in substrate 20 adjacent one side thereof (hereinafter the "front side") using known phosphorus diffusion techniques, such as the one employed in the U.S. Pat. No. 4,612,698 to Gonsiorawski et al (hereinafter referred to as the "'698 patent"). Aluminum layer 62 was applied to the opposite side of substrate 20 using conventional deposition methods such as screen printing followed by high temperature alloying, this deposition method also being of the type used in the '698 patent. Metallic conductors 64 were applied to the front surface of substrate 20 using known evaporation processes. Conductors 64 form a grid-type electrode as is normally used in solar cells.

Next, substrate 20 is secured to support members 50 and heating device 52 is actuated to elevate the temperature of substrate 20 to between about 400° to 800° C. Depending upon the heat output of heating device 52, this heating step takes about 1 to 5 minutes.

Thereafter, Kaufman ion source 24 is actuated, creating an $SiF_4$ ion beam 39 which reacts with substrate 20 in a manner effecting a bulk passivation of the substrate. Preferably, Kaufman ion source 24 is controlled so as that ion beam 39 has a beam voltage of between about 800 to 2000 eV, a beam current of between about 1 to 3 $mA/cm^2$, and a beam pressure of between about 7 to 12 mTorr. Substrate 20 is preferably exposed to ion beam 39 for between about 20 to 180 seconds. $SiF_4$ gas is delivered to Kaufman ion source 24 at a flow rate of about 1 $cm^3$/min. Heating device 52 is operated so as to maintain the temperature of substrate 20 at between about 400° to 850° C. during passivation. This operating regime provides satisfactory bulk fluorine passivation of substrate 20 while at the same time not causing any deterioration of p/n junction 60. Preferably, the front surface of substrate 20 does not have a silicon nitride, phosphorus glass or anti-reflection coating deposited thereon prior to this ion beam exposure step.

As the final step, an anti-reflection coating 66 is applied to the front surface of substrate 20. This last step may be accomplished by any of a number of known methods, such as by chemical vapor deposition of, for instance, $TiO_2$. Alternatively, anti-reflection coating 66 may be formed by the plasma deposition of silicon nitride.

Test Results

To substantiate that bulk passivation was achieved with the present invention, sample silicon substrates 20 bulk passivated in accordance with the preferred embodiment have been subjected to several tests. As a first test, fluorine passivated substrates were subjected to conventional Electron Beam Induced Current ("EBIC") analysis which revealed that recombination had decreased at twin boundaries. The reduction in recombination was qualitatively almost identical to the reduction occurring in hydrogen passivated substrates. Quantitatively, the depth of penetration of fluorine was less than that of hydrogen. EBIC analysis revealed that fluorine penetrated the bulk of the substrate up to a depth of about 10 microns. By way of contrast, hydrogen passivants typically penetrate the substrate to depths of at least 20 to 80 microns, and in some cases, hundreds of microns.

It is believed that fluorine passivants do not penetrate as deeply as hydrogen passivants because fluorine has a lower diffusivity rate than that of hydrogen. To encourage deeper fluorine penetration, heating device 52 (FIG. 2) is used to heat substrate 20 to a higher temperature, e.g. 650° C., than would occur from ion beam exposure alone. Since the diffusivity of fluorine increases with temperature, by elevating the temperature of substrate 20, greater fluorine penetration is achieved.

As a second test of the effectiveness of the present method, ultraviolet surface reflectivity measurements were made of silicon substrates passivated in accordance with the invention, before and after passivation. The tests showed changes in reflectivity of only 1 to 2 percent due to the present passivation process. Because both solar cell efficiencies and ultraviolet reflectivities decrease with increases in surface damage, these relatively small changes in reflectivity indicate the present fluorine passivation method will not have any significant adverse affect on the efficiency of a solar cell fabricated using the present method.

The reflectivity tests revealed that surface damage in fluorine passivated substrates ions is substantially less than that occurring in hydrogen passivated substrates. Consequently, the fluorine passivated regions of the substrate cannot be readily used as a plating mask in accordance with the method of the '698 patent. In the solar cell fabrication process of the '698 patent, plating masks are formed by damaging selected regions of a silicon substrate by hydrogen passivating the selected regions. Metallic conductors deposited by immersion plating in accordance with the method of U.S. Pat. No. 4,321,283 to Patel et al do not adhere to these selected hydrogen passivated regions.

As a third test, the $V_{oc}$ and $J_{sc}$ of sample substrates were measured before and after fluorine passivation. Increases in $V_{oc}$ of from 10 to 16 mV were detected and $J_{sc}$ increases of as high as 1 $mA/cm^2$ were measured. These increases clearly indicate that bulk fluorine passivation was effected in the sample substrates.

Fluorine has several advantages over hydrogen as a passivation component. Since the silicon-fluorine bonds resulting from the passivation process are up to 60% stronger than the silicon-hydrogen bonds resulting from conventional hydrogen passivation processes, the passivating fluorine tends to remain disposed within the substrate even at elevated temperatures. Consequently, high temperature semiconductor fabrication processes may be subsequently performed on the substrate without driving off the fluorine. Additionally, the life expectancy of a fluorine-passivated semiconductor device is greater than that of a hydrogen-passivated device since the highly stable silicon-fluorine bond tends to prevent out-diffusion of the fluorine.

The use of a Kaufman ion source to create the fluorine ion beam in place of a conventional plasma reactor is advantageous from several standpoints. First, it is believed that in view of the relatively low diffusivity of fluorine, conventional plasma reactors do not form fluorine ion beams having sufficient energy to penetrate into and to bulk passivate a crystalline silicon substrate. Second, fluorine passivation is effected at a much more rapid rate using a Kaufman ion source than is typically possible with a conventional plasma reactor, because the density of fluorine ions produced by the Kaufman ion source can be greater than the density of ions produced by a conventional plasma reactor.

EXAMPLE OF PREFERRED EMBODIMENT

Referring to FIGS. 1 and 2, the present bulk passivation method may be advantageously employed in the fabrication of solar cells, as set forth in the following theoretical example. A crystalline silicon substrate 20 made from EFG process p-type silicon ribbon is provided as the starting material. Substrate 20 includes a p/n junction 60 formed therein adjacent one side (hereinafter the "front side") of the substrate. Junction 60 may be formed using well-known phosphorous diffusion techniques, such as those disclosed in the '698 patent. An aluminum backing layer 62 is provided on the opposite side of substrate 20. Layer 62 may be applied using conventional methods, such as screen printing followed by high temperature alloying, these aluminum layer application processes also being described in the '698 patent. Metallic conductors 64 are attached to the front side of substrate 20 using conventional metallization processes, such as evaporation.

In accordance with the first step of the present method, as set forth above, substrate 20 is positioned adjacent a Kaufman ion source 24. The substrate 20 is supported on support members 50 made from a material that is a relatively poor conductor of heat energy. A heating device 52 is positioned adjacent substrate 40.

As described above with respect to the second step of the present invention, substrate 20 is heated to 650° C. using the heating device 52. This heating step will take about 4 minutes.

In accordance with the third step of the present method, substrate 20 is bulk passivated using Kaufman ion source 24 coupled to a source of $SiF_4$ gas. The Kaufman ion source is controlled so as to produce an ion beam 39 having a beam voltage 1000 eV, a beam current density of 2 $mA/cm^2$ and a beam pressure of 10 mTorr. Substrate 20 is exposed to the $SiF_4$ ion beam for 40 seconds. The heating device 52 is operated during the ion beam exposure so as to maintain substrate 20 at a temperature of 650° C. This operating regime provides satisfactory bulk passivation of substrate 20 while at the same time not causing deterioration of p-n junction 60. Further, prolonged exposure of Si to a F ion is believed to remove part of the surface layer by etching or sputtering.

As the final step, an anti-reflection coating 66 is applied to the front surface of substrate 20. This last step may be accomplished by any of a number of known methods, such as by chemical vapor deposition of, for instance, $TiO_2$. Alternatively, anti-reflection coating 66 may be formed by the plasma deposition of silicon nitride.

Alternate Embodiment

As noted above, substrate 20 may be made from germanium, gallium arsenide or other III-V compounds, or II-VI compounds such as cadmium telluride, zinc sulfide, or zinc selenide instead of silicon. In the alternative embodiment of the present invention, a substrate made from germanium, gallium arsenide or other III-VI compounds, or II-VI compounds, but otherwise identical to the substrate employed in the preferred embodiment, may be fluorine passivated by subjecting the substrate to the $SiF_4$ ion beam 39 for a suitable time period e.g., 15-200 seconds. In every other respect, the process of the alternative embodiment is identical to the process of the preferred embodiment, and solar cells and other semiconductor devices may be made according to the teachings presented hereinabove adapted to compensate for the different properties of germanium, gallium arsenide and other III-V compounds, and II-VI compounds.

Since certain changes may be made in the above process without departing from the scope of the invention herein involved, it is intended that all matter contained in the above description or shown in the accompanying drawings shall be interpreted in an illustrative and not limiting sense.

What is claimed is:

1. A method of fabricating a solar cell comprising in sequence the steps of:
   (a) providing a polycrystalline silicon substrate having a p/n junction formed therein adjacent one side of the substrate, said substrate having an electrode grid on one side and an aluminum layer on the other side thereof, further wherein said one side is not coated with a layer of silicon nitride or phosphorus glass;
   (b) exposing said one side of the substrate to an $SiF_4$ ion beam of an intensity and for a duration sufficient to bulk passivate said substrate; and
   (c) applying an antireflection coating to said one side of said substrate.

2. A method according to claim 1 further including the step of heating said silicon substrate to a temperature of between 400° to 800° C. prior to said ion beam exposure step.

3. A method according to claim 1 wherein said substrate is bulk passivated to a depth of about 10 microns.

4. A method of fabricating a solar cell comprising in sequence the steps of:
   (a) providing a polycrystalline silicon substrate having a p/n junction formed therein adjacent one side of the substrate, wherein said one side is not coated with a layer of silicon nitride of phosphorus glass;
   (b) exposing said one side of the substrate to an $SiF_4$ ion beam of an intensity and for a duration sufficient to bulk passivate said substrate; and
   (c) applying an antireflection coating to said one side of said substrate.

5. A method according to claim 4 further including the step of heating said silicon substrate to a temperature of between 400° and 800° C. prior to said ion beam exposure step.

6. A method according to claim 4 wherein said $SiF_4$ ion beam is generated by a Kaufman ion source which is controlled so as operate at an intensity of between 800 to 2000 eV, with a current density of 1 to 3 $mA/cm^2$, and for a duration of between 20 to 180 seconds.

* * * * *